(12) United States Patent
Hörling et al.

(10) Patent No.: US 7,083,868 B2
(45) Date of Patent: Aug. 1, 2006

(54) COMPOSITE STRUCTURED WEAR RESISTANT COATING

(75) Inventors: Anders Hörling, Linköping (SE); Lars Hultman, Linköping (SE); Jacob Sjölén, Fagersta (SE); Lennart Karlsson, Fagersta (SE)

(73) Assignee: Seco Tools AB, Fagersta (SE)

( * ) Notice: Subject to any disclaimer, the term of this patent is extended or adjusted under 35 U.S.C. 154(b) by 313 days.

(21) Appl. No.: 10/653,275

(22) Filed: Sep. 3, 2003

(65) Prior Publication Data
US 2004/0115484 A1 Jun. 17, 2004

(30) Foreign Application Priority Data
Sep. 4, 2002 (SE) .................... 0202632

(51) Int. Cl.
*B32B 9/00* (2006.01)
(52) U.S. Cl. .................... 428/697; 51/307; 51/309; 428/698; 428/699
(58) Field of Classification Search ............ 51/307, 51/309; 428/697, 698, 699, 325
See application file for complete search history.

(56) References Cited

U.S. PATENT DOCUMENTS

| 5,272,014 | A |   | 12/1993 | Leyendecker et al. |
| 5,330,853 | A |   | 7/1994 | Hofmann et al. |
| 5,503,912 | A |   | 4/1996 | Setoyama et al. |
| 5,656,383 | A | * | 8/1997 | Tanaka et al. ............... 428/699 |
| 5,981,049 | A |   | 11/1999 | Ohara et al. |
| 6,077,596 | A |   | 6/2000 | Hashimoto et al. |
| 6,103,357 | A |   | 8/2000 | Selinder et al. |
| 6,254,984 | B1 |   | 7/2001 | Iyori |
| 6,309,738 | B1 |   | 10/2001 | Sakurai |
| 6,824,601 | B1 | * | 11/2004 | Yamamoto et al. ......... 428/698 |

(Continued)

FOREIGN PATENT DOCUMENTS

EP 0 701 982 A1 3/1996

(Continued)

OTHER PUBLICATIONS

E. Vancoille et al., "Mechanical properties of heat treated and worn PVD TiN, (Ti, Al)N, (Ti, Nb)N and Ti(C, N) coatings as measured by nanoindentation", *Thin Solid Films*, vol. 224, No. 2, Mar. 15, 1992, pp. 168-176.

(Continued)

*Primary Examiner*—Archene Turner
(74) *Attorney, Agent, or Firm*—Drinker Biddle & Reath LLP

(57) ABSTRACT

The present invention relates to a cutting tool insert having a substrate and a coating, the coating is composed of one or more layers of refractory compounds of which at least one layer includes a composite structured $(Ti_yAl_xMe_{1-x-y})N$ layer, where Me is one of the element Zr, Hf, V, Nb, Ta, Cr, Mo, W or Si, defined by:

x is between 0.60 and 0.80 the ratio, $R=x/(x+y)$, is between 0.60 and 0.85 the sum of Ti and Al subscript, $S=x+y$, is between 0.7 and 1.0 the co-existence of crystalline hexagonal h-AlN and cubic $c-(Ti_yAl_xMe_{1-x-y})N$ as detected by X-ray diffraction (XRD), defined by the ratio between the area of the h-AlN (100) peak at approximately 33° 2θ (=A(h-AlN)$_{100}$) and the $c-(Ti_yAl_xMe_{1-x-y})N$ (200) peak at approximately 43° 2θ (=A(c-(Ti,Al,Me)N)$_{200}$) called K, i.e. K=A(h-AlN)$_{100}$/A(c-(Ti,Al,Me)N)$_{200}$. K is >0.08, and The FWHM (Full Width Half Maximum) value of the:
$c-(Ti_bAl_aMe_{1-a-b})N$ (200) peak is <1.4 °2θ
h-AlN (100) peak is between 0.2 and 1.5° 2θ.

11 Claims, 4 Drawing Sheets

U.S. PATENT DOCUMENTS

2002/0081161 A1    6/2002  Yamada et al.

FOREIGN PATENT DOCUMENTS

| EP | 0 709 483 A2 |   | 5/1996  |
|----|--------------|---|---------|
| EP | 1 174 528 A2 |   | 1/2002  |
| EP | 1201776      | * | 5/2002  |
| EP | 1 219 723 A2 |   | 7/2002  |
| JP | 62074076     |   | 4/1987  |
| JP | 01287246     |   | 11/1989 |
| JP | 9295204      |   | 11/1997 |
| JP | 11-131216    | * | 5/1999  |
| JP | 11310867     |   | 11/1999 |
| JP | 2001-234328  | * | 8/2001  |

OTHER PUBLICATIONS

Abstract XP-002271015 (GOBEL et al., "Stress measurements in thermal loaded (Ti,Al)N hard coatings", *Surf. Coat. Technol.*, vol. 142-144, Jul. 2001).

Abstract XP-002271016 (KNOTEK et al., "The influence of the composition and coating parameters of PVD Ti-Al-V(C,N) films on abrasive and adhesive wear of coated cemented carbides", *Wear*, vol. 133, No. 1, Sep. 1989).

Hermann A. Jehn et al., Morphology and Properties of Sputtered (Ti,Al)N Layers on High Speed Steel Substrates as a Function of Deposition Temperature and Sputtering Atmosphere, J. Vac. Sci. Technol. A 4 (6), 2701 (1986).

O. Knotek et al., On Structure and Properties of Sputtered TI and Al Based Hard Compound Films, J. Vac. Sci. Technol. A 4 (6), 2695 (1986).

B.-J. Kim et al., High Temperature Oxidation of $(Ti_{1-x}Al_x)N$ Coatings Made by Plasma Enhanced Chemical Vapor Deposition, J. Vac. Sci. Technol. A 17(1), 133 (1999).

W.-D. Münz, Titanium Aluminium Nitride Films—A New Alternatice to TiN Coatings, Int. Conf. Met. Coat., San Diego, USA (1986).

Harland G. Tompkins, Oxidations of Titanium Nitride in Room Air and in Dry $O_2$, J. Appl. Phys. 70 (7), 3876 (1991).

D. McIntyre et al., Oxidation of Metastable Single-Phase Polycrystalline $Ti_{0.5}Al_{0.5}N$ Films: Kinetics and Mechanisms, J. App. Phys. 67 (3), 1542 (1990).

H. Holleck, Metastable Coatings—Prediction of Composition and Structure, Surf. and Coat. Technol, 36, 151 (1988).

* cited by examiner

COMPOSITE STRUCTURED WEAR RESISTANT COATING

This application claims priority under 35 U.S.C. §119 to 0202632-6 filed in Sweden on Sep. 4, 2002; the entire content of which is hereby incorporated by reference.

FIELD OF THE INVENTION

The present invention relates to a cutting tool for machining by chip removal having a substrate of cemented carbide, cermet, ceramics, cubic boron nitride based material or high speed steel and a hard and wear resistant refractory coating of which at least one layer comprises a composite structured $(Ti_yAl_xMe_{1-x-y})N$ layer, where Me is one of the elements Zr, Hf, V, Nb, Ta, Cr, Mo, W or Si. This invention is particularly useful in metal cutting application were the chip thickness is small, e.g.—copy milling using solid end mills.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Since the early 1980's, golden-coloured TiN-layers have been widely used for surface protective applications. In order to improve the oxidation resistance of these coatings, work began in the mid-1980's with adding aluminium to TiN [see, e.g.—H. A. Jehn, et al, J. Vac. Sci. Technol. A 4, 2701 (1986) and O. Knotek et.al, J. Vac. Sci. Technol. A 4, 2695 (1986)]. The compound thus formed, cubic-phase $Ti_{1-x}Al_xN$, was found to have superior oxidation resistance and enabled greater cutting speeds during machining, prolonged tool life, machining of harder materials, and improved manufacturing economy.

The mechanisms responsible for the excellent cutting performance of $Ti_{1-x}Al_xN$-coated tools have this far been associated with the coating's oxidation resistance. B.-J. Kim et.al., J. Vac. Sci. Technol. A 17(1), 133 (1999) reported that an increased aluminium content in the $Ti_{1-x}Al_xN$ compound improves the oxidation resistance. TiN oxidises rapidly at temperatures of 500–600° C. according to W. D. Münz, invited paper Int. Conf. Met. Coat., San Diego, USA (1986) and H. G. Tompkins, J. Appl. Phys. 70, 3876 (1991), whereas oxidation of $Ti_{1-x}Al_xN$ starts at 750–900° C. [D. McIntyre et. al., J. Appl. Phys. 67, 1542 (1990)]. This gives an increased upper operating temperature of $Ti_{1-x}Al_xN$ compared to TiN from 450–500° C. to 750-800° C. according to Münz et al This concept of mainly $Ti_{1-x}Al_xN$ based materials, has been a subject for a large number of further optimization of different types, like macroscopically compositional gradients over the coated components as U.S. Pat. No. 5,272,014 discloses. Another way of optimization has been by applying different concepts of multilayer as; alternating Ti and Al containing layers (U.S. Pat. No. 6,309,738), oxygen and non-oxygen containing layers (U.S. Pat. No. 6,254,984), one of the layers stacked in the multilayer consists itself of a multilayer (U.S. Pat. No. 6,077,596), alternating nitrogen content (U.S. Pat. No. 5,330,853) or using one metastable compound (U.S. Pat. No. 5,503,912) or as an aperiodic multilayer (U.S. Pat. No. 6,103,357).

H. Holleck, Surf. Coat. Technol. 36, 151 (1988) has reported that the solid solubility of AlN in TiN is extremely low, and only at 2,700K it reaches ~5 mol %. For larger AlN fractions, or at lower temperatures, the equilibrium system consists of cubic TiN and hexagonal AlN. However, as is well known, $Ti_{1-x}Al_xN$ can be deposited as a metastable cubic structure by using physical vapour deposition (PVD). At an elevated temperature during heat treatment or operation of a coated cutting tool, enough energy may then be supplied that phase separation into c-TiN and h-AlN occurs which normally deteriorates the wear resistance of the coating.

SUMMARY OF THE INVENTION

It is an object of the present invention to provide a coating comprising layer consisting of a nanometer sized composite structure of h-AlN and $(Ti_bAl_aMe_{1-a-b})N$ to be applied to a cutting tool for machining by chip removal.

It is a further object of the present invention to provide a method for depositing nano-crystalline layers with an overall composition of $(Ti_yAl_xMe_{1-x-y})N$. Surprisingly, we have now found that by balancing the chemical composition and the amount of thermal energy added, enhanced performance can be achieved by utilizing phase separation and re-crystallization of the $(Ti_yAl_xMe_{1-x-y})N$ layer into h-AlN dissolved in the cubic c-$(Ti_bAl_aMe_{1-a-b})N$ matrix, where a and b are not necessarily the same as x and y. The layer has low macroscopic compressive residual stress and includes a nanometer sized composite structure of hexagonal h-AlN finely dispersed into a matrix of nanometer sized cubic c-$(Ti_bAl_aMe_{1-a-b})$. The layer is deposited using a PVD-technique. This type of layer will hereafter be called composite-TiAlN.

According to one aspect, the present invention provides a cutting tool insert comprising a substrate and a coating wherein the coating comprising one or more layers of refractory compounds of which at least one layer comprises a composite structured $(Ti_yAl_xMe_{1-x-y})N$ layer, where Me is one of the element Zr, Hf, V, Nb, Ta, Cr, Mo, W or Si, and wherein:

x is between 0.60 and 0.80;

a ratio, R=x/(x+y), is between 0.60 and 0.85;

a sum of Ti and Al subscripts, S=x+y, is between 0.7 and 1.0;

co-existence of crystalline hexagonal h-AlN and cubic c-$(Ti_yAl_xMe_{1-x-y})N$ as detected by X-ray diffraction (XRD), defined by the ratio K between the area of the h-AlN (100) peak at approximately 33° 2θ (=A(h-AlN)$_{100}$) and the c-$(Ti_yAl_xMe_{1-x-y})N$ (200) peak at approximately 43° 2θ (=A(c-(Ti,Al,Me)N)$_{200}$) wherein K=A(h-AlN)$_{100}$/A(c-(Ti,Al,Me)N)$_{200}$, and K is >0.08; and a Full Width Half Maximum value of the c-$(Ti_bAl_aMe_{1-a-b})$N (200) peak <1.4 °2θ, and the value of the h-AlN (100) peak is between 0.2 and 1.5° 2θ.

DETAILED DESCRIPTION OF THE INVENTION

Figure 1:
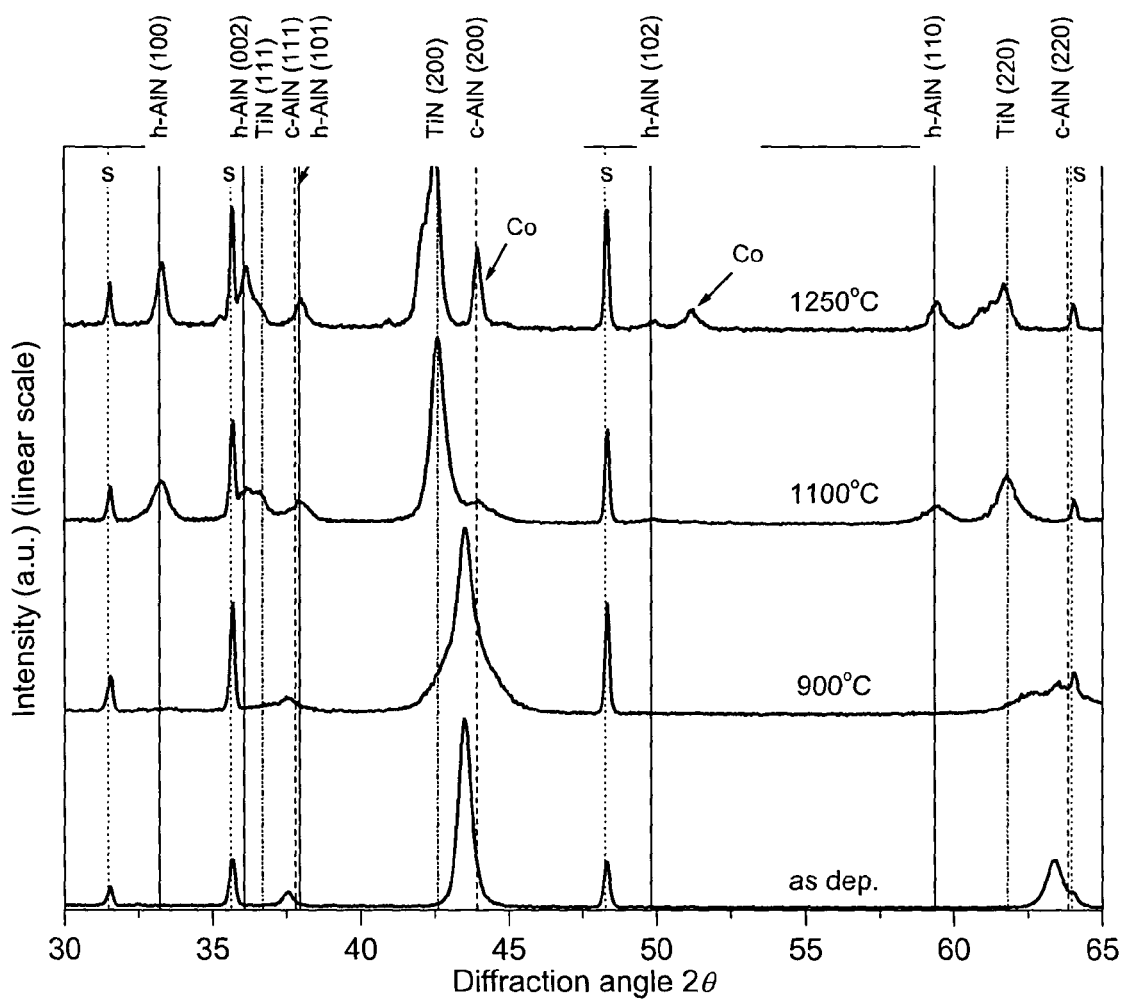
FIG. 1 illustrates X-ray diffraction patterns obtained from $(Ti_{0.34}Al_{0.66})(N_{0.97}O_{0.03})_{0.92}$ layers in as-deposited and annealed conditions.

According to the present invention there is provided a cutting tool for machining by chip removal comprising a body of a hard alloy of cemented carbide, cermet, ceramics, cubic boron nitride based material or high speed steel onto which a wear resistant coating is deposited composed of one or more layers of refractory compounds comprising at least one composite-TiAlN layer(s). Additional layer(s) may be composed of metal nitrides and/or carbides and/or oxides with the metal elements chosen from Ti, Zr, Hf, V, Nb, Ta, Cr, Mo, W, Si and Al grown using physical vapour deposition (PVD) or other deposition technologies such as plasma enhanced chemical vapour deposition (PACVD) and/or chemical vapour deposition (CVD). This invention is particularly useful in metal cutting application were the chip thickness is small, e.g.—copy milling using solid end mills.

The composite-TiAlN-layer(s) has a crystalline nanometer sized composite structure of hexagonal AlN (h-AlN) finely dispersed into a nanometer sized $(Ti_bAl_aMe_{1-a-b})N$ matrix, where a and b are not necessarily the same as x and y describing the overall composition as $(Ti_yAl_xMe_{1-x-y})N$. The layer has a low macroscopic compressive residual stress state between 0 and −3.5 GPa, preferably between 0 and −2 GPa. Me is one or several of the elements Zr, Hf, V, Nb, Ta, Cr, Mo, W and/or Si, preferably V, Zr, Ta, and/or Nb and most preferably Zr and/or Nb. If Me is V and/or Mo it is preferable that the composite-TiAlN is not the outermost layer. If the composite-TiAlN is the outermost layer, and Me is V and/or Mo, those elements should not be present in the very outermost part of the layer, since those metals forms low melting point and volatile oxides. This oxidation process will be detrimental for the properties of the composite-TiAlN layer. Therefore, the outer 30% of the composite-TiAlN layer is preferably free of V and/or Mo when this layer is the outermost layer.

If Me is Ta, the compressive residual stress state of the as-deposited composite-TiAlN layer will increase to very high values due to high momentum ion bombardment during growth of film surface. This high momentum is due to the high average charge state and the high atomic weight of Ta. In order to compensate for this, a second Me element should be added, preferably Cr, which due to good surface mobility, heals defects thereby reducing the compressive residual stress. Preferably, the content (in atomic %) of Cr ($Me_{Cr}$) is 10–30% higher than the content of Ta ($Me_{Ta}$), i.e.— $1.10*Me_{Ta}<Me_{Cr}<1.30*Me_{Ta}$, and preferably $1.10*Me_{Ta}<Me_{Cr}<1.20*Me_{Ta}$.

In $(Ti_yAl_xMe_{1-x-y})N$ "x" is between 0.6 and 0.80, preferably between 0.6 and 0.75. The ratio, $R=x/(x+y)$, is between 0.6 and 0.85, and preferably between 0.6 and 0.75. The sum of the Ti and Al subscripts, $S=x+y$, is preferably between 0.7 and 1.0, and most preferably between 0.8 and 1.0. In one preferred embodiment x+y=1 and in another embodiment x+y<1. The notation used herein, $(Ti_yAl_xMe_{1-x-y})N$, implies stoichiometry between metal atoms, i.e.—between $(Ti_yAl_xMe_{1-x-y})$ and N. However, perhaps a more accurate notation would be $(Ti_yAl_xMe_{1-x-y}))N_j$ where j is between 1.2 and 0.8, preferably between 0.9 and 1.05. In further description, the simpler notation of $(Ti_yAl_xMe_{1-x-y})N$ will be used, except for example 1, where an exact measurement of the stoichometry has been performed. In addition, coatings grown in industrial deposition systems almost always contain a certain amount of oxygen (O) due to residual gases in the system, as demonstrated in example 1. Thus, it should be understood that, although not explicitly accounted for by the above-mentioned notation, oxygen may be present in the compound.

The composite-TiAlN layer has an enhanced hardness, toughness and thermal stability, due to a controlled transformation of the cubic (rocksalt structure) c-$(Ti_yAl_xMe_{1-x-y})N$ layer into nanometer sized hexagonal h-AlN, finely dispersed in a matrix of cubic c-$(Ti_bAl_aMe_{1-a-b})N$ where a and b not necessarily are the same as x and y. The layer is characterised by:

The co-existence of crystalline hexagonal h-AlN and cubic c-$(Ti_bAl_aMe_{1-a-b})N$ as detected by X-ray diffraction (XRD).

The FWHM (Full Width Half Maximum) value of the:
c-$(Ti_yAl_xMe_{1-x-y})N$ (200) peak <0.8° 2θ; and
h-AlN (100) peak is between 0.2 and 2.0° 2θ, preferably between 0.2 and 1.5° 2θ.

The ratio (K) between the area of the h-AlN (100) peak at approximately 33° 2θ and the $(Ti_bAl_aMe_{1-a-b})N$ 200 peak at approximately 43° 2θ (using Cu Kα radiation), called K, is preferably >0 and most preferably >0.1.

Composite-TiAlN layer(s) include grains of c-$(Ti_bAl_aMe_{1-a-b})N$ and h-AlN with a grain size of <20 nm.

The composite-TiAlN layer(s) can also be deposited directly onto the cutting tool substrate as a single layer. The thickness of the composite-TiAlN layer(s) varies between 0.5 and 12 μm, preferably between 0.5 and 8 μm, especially for machining by chip removal.

The total coating thickness, if the composite-TiAlN layer(s) according to the present invention is combined with other layer(s), varies between 0.5 and 15 μm, preferably between 1 and 12 μm with the thickness of the non-composite-TiAlN layer(s) varying between 0.5 and 8 μm.

In an alternative embodiment the composite-TiAlN layer(s) have a thickness 0.5 and 10 μm, with or without other layer(s) according to above described, an outer 0.5 to 5 μm thick layer comprising a solid low friction material based on $MoS_2$ or a MeC/C, where Me is Cr, W, Ti or Ta, can be deposited on top of the coating.

In yet an alternative embodiment, the composite-TiAlN layer(s) have a thickness between 0.1 and 2 μm are one of 1 to 5 different materials in a 1.0 to 15 μm thick multi-layer coating comprising 2–500, preferably 5–200, individual layers.

In yet another alternative embodiment, the composite-TiAlN layer(s) of 0.5 and 20 μm thickness can be deposited on top of a CVD coating which may comprise one or several layer(s) of a crystalline $Al_2O_3$.

The method used to grow the coatings comprising a composite-TiAlN layer(s) of the present invention are based on arc evaporation of an alloy or composite cathode under the following conditions:

The Ti/Al-cathode composition is between (50 at % Ti+50 at % Al) and (20 at % Ti+80 at % Al), preferably between (35 at % Ti+65 at % Al) and (25 at % Ti+75 at % Al).

Evaporation current is between 50 A and 200 A depending on cathode size. Using cathodes of 63 mm in diameter, the current is preferably between 50 A and 80 A.

$Ar/N_2$ atmosphere of 0–50 vol % Ar, preferably 0–20 vol %, at total pressure of 1.0 Pa to 9.0 Pa, preferably 1.5 Pa to 5.0 Pa.

Substrate bias of −10 V to −300 V, preferably −40 V to −120.

Deposition temperature shall be between 400° C. and 700° C., preferably 500° C. and 650° C.

To grow a $(Ti_yAl_xMe_{1-x-y})N$, where Me is one or several of the elements Zr, Hf, V, Nb, Ta, Cr, Mo, W or Si, alloyed cathodes are used. An alternative is to use one/several pure Me cathode(s) and to position this/these cathodes at a longer distance from the substrates than the Ti/Al cathodes are positioned. In this way the preferable alloying of the (Ti,Al)N layer can also be made.

If pure V or Zr cathode(s) is/are used, the evaporation current is preferably between 60 A and 90 A. For Nb and Ta, the current is between 80 A and 100 A. Those current values are suitable for cathodes of 63 mm in diameter but will be different for other cathode sizes.

Since the $(Ti_yAl_xMe_{1-x-y})N$-phase also forms metal carbonitride or carbonitrideoxide compounds, and by using PVD-technique to grow the composite-TiAlN layer, carbon and/or oxygen containing gas can be added to the atmosphere during deposition (e.g. $C_2H_2$ or $CH_4$, CO, $O_2$), so that carbon/oxygen alloyed composite-TiAlN layer(s) can be obtained with an overall composition of $(Ti_yAl_xMe_{1-x-y})N_{1-d-e}C_dO_e$ where d+e is between 0 and 0.2.

Annealing is preferably performed in inert atmosphere of Ar and/or $N_2$ at a temperature between 900° C. and 1100° C. over a period of 20 to 240 min. However, the optimal temperature and period is given by the phase separation into the preferable composite structure as can be seen by XRD analysis. The annealing can also be performed in-situ in the deposition system, if the system can generate enough thermal energy to obtain the preferred phase separation. One possibility to obtain the phase separation is to deposit a CVD coating, at a deposition temperature of 800° C. to 1050° C., on top of the as-deposited Composite-TiAlN layer.

The present invention has been described with reference to layer(s) of a composite—TiAlN-layer(s) deposited using arc evaporation. Composite—TiAlN-layer(s) could also be produced using other PVD-technologies as magnetron sputtering, electron beam evaporation, ion plating or laser ablation.

EXAMPLE 1

Cemented carbide substrates with composition 93.5 wt % WC, 6 wt % Co, 0.5 wt % (Ta,Nb)C were used. The WC grain size was about 1 μm and the hardness was 1630 $HV_{10}$. The substrates were ground on diamond disks and polished using fine-grained diamond slurry in order to obtain a mirror like surface for the material analysis.

Before deposition, the substrates were cleaned in ultrasonic baths of an alkali solution and alcohol. The shortest cathode-to-substrate distance was 160 mm. The system was evacuated to a pressure of less than $2.0 \times 10^{-3}$ Pa, after which the substrates were sputter cleaned with Ar ions. The (Ti,Al)N layer was grown using arc evaporation of six Ti/Al (33 at % Ti+67 at % Al) (variants A–D) or (25 at % Ti+75 at % Al) (variants E–H) cathodes (63 mm in diameter) in an 99.995% pure $N_2$ atmosphere at a total pressure of 2.0 Pa, using a substrate bias of −90 V. The deposition was carried out during 60 min in order to obtain a coating thickness of approximately 3 μm. The deposition temperature was ~530° C. Immediately after deposition the chamber was vented with dry $N_2$.

Isothermal post annealing of the coated inserts was carried out at various temperatures in a hot-wall quartz-tube furnace with a 0.40 m long constant temperature (±5° C.) zone. The inserts were inserted into the furnace, which was already heated to and stabilised at the desired temperature. The annealing experiments were performed in flowing Ar at atmospheric pressure for a period of 120 min.

Separate layers, thickness 300–400 nm, intended for chemical characterization were deposited onto pure carbon substrates using identical process parameters. The chemical analysis was also performed by Rutherford backscattering spectrometry (RBS), using $4He^+$ ions of 1.8 MeV and a scattering angle of 170°. The RUMP software was used for evaluating raw data. The obtained composition of the as-deposited layers was $(Ti_{0.34}Al_{0.66})(N_{0.97}O_{0.03})_{0.92}$ and $(Ti_{0.26}Al_{0.74})(N_{0.99}O_{0.01})_{0.89}$, respectively.

The XRD patterns, produced using Cu Kα radiation and a configuration with a constant grazing incidence angle of 2° of the as-deposited and annealed $(Ti_{0.34}Al_{0.66})(N_{0.97}O_{0.03})_{0.92}$ layers are shown in FIG. 1. The as-deposited layers consist of a single-phase [NaCl] structure. After annealing at 900° C. the c-(200) layer peak became broader, i.e. the FWHM value increased from 0.47 to 0.67° 2θ. Annealing at 1100° C. resulted in a decreased FWHM of the c-(200) to 0.56° 2θ, also h-AlN was formed as seen by the h-(100) peak at 33° 2θ with a FWHM value of 0.53° 2θ. Annealing at higher temperature sharpened the h-(100) peak and broadened the c-(200) peak.

Figure 2:
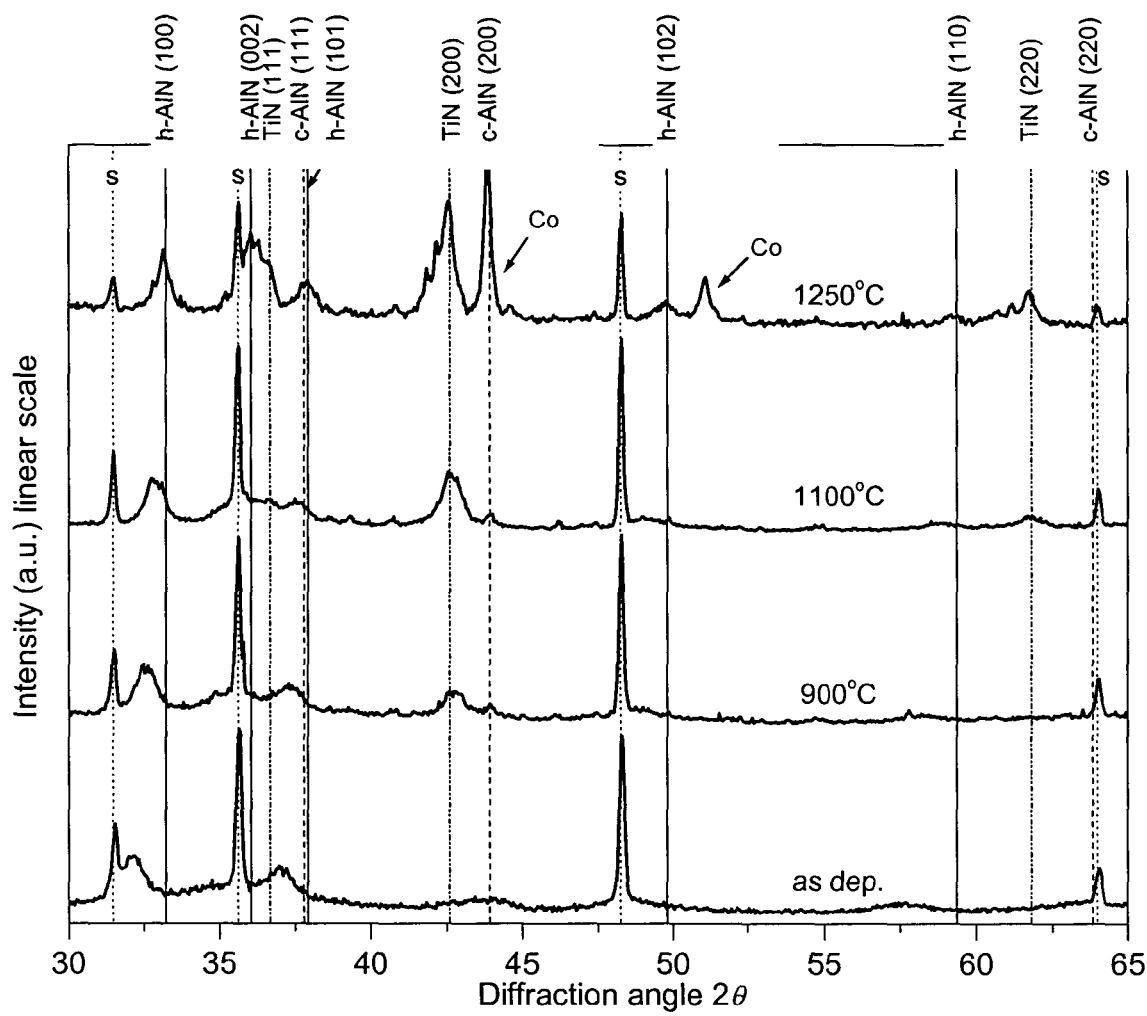
FIG. 2 illustrates X-ray diffraction patterns obtained from $(Ti_{0.26}Al_{0.74})(N_{0.99}O_{0.01})_{0.89}$ layers in as-deposited and annealed conditions.

The XRD patterns of as-deposited and annealed $(Ti_{0.26}Al_{0.74})(N_{0.99}O_{0.01})_{0.89}$ layers are shown in FIG. 2. The as-deposited layer was composed of h-AlN, no c-(Ti,Al)N (200) could be detected by XRD, meaning that the c-(Ti,Al)N detected by TEM-SAED (Transmission Electron Microscope Selected Area Electron Diffraction) is x-ray amorphous due to small grain size. However, annealing at 900° C. made the c-(Ti,Al)N (200) peak appear. The FWHM of both the h-(100) and the c-(200) decreased with increased annealing temperature.

Additional peaks originating from Co were observed for both layer compositions after annealing at 1250° C. as a result of Co migration up onto the coating surface during this high temperature annealing.

The macroscopic residual stress state of the layers was determined by using a substrate curvature technique described by Ramsey et al, Surf. Coat. Technol. 43–44, 223 (1990) and Stoney Proc. R. Soc. London A 82, 172 (1909). The coated WC-Co platelets, $5 \times 5 \times 0.8$ $mm^3$, were prepared by cutting, grinding and polishing to a final thickness between 200–300 μm. The macroscopic residual stress of the layers was compressive and largest in the as-deposited $(Ti_{0.34}Al_{0.66})(N_{0.97}O_{0.03})_{0.92}$ at $-2.3 \pm 0.5$ GPa (assuming $E_{WC-6\ wt\ \%\ Co} = 600$ GPa, $v_{WC-Co} = 0.22$). Annealing at 900° C. for 120 min resulted in stress relaxation for both layer compositions to around −1 GPa, see table 2.

Figure 3A:
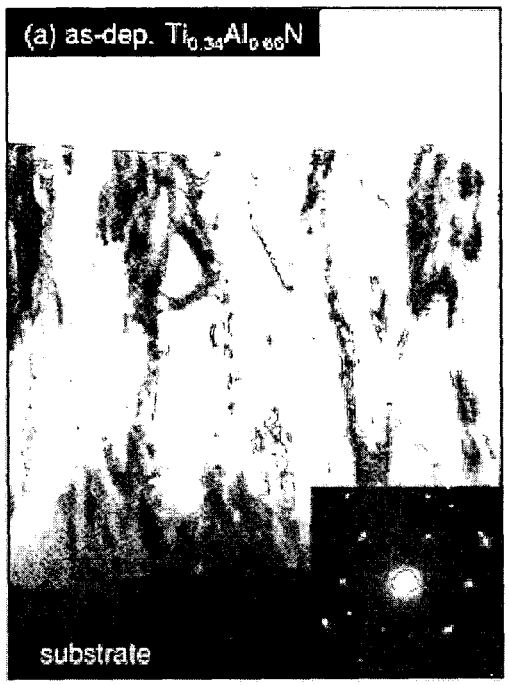
FIG. 3 is a TEM micro graph of $(Ti_{0.34}Al_{0.66})(N_{0.97}O_{0.03})_{0.92}$ layers in (a) as-deposited, (b) 120 min at 900° C. (c) 120 min at 1100° C. annealed conditions.
Figure 3B:
Figure 3C:

Cross-sectional transmission electron microscope (TEM) imagery was used to study the microstructure of the coatings. The sample preparation consisted of mechanical grinding and polishing followed by ion-beam sputter etching on both upper and lower surfaces. Cross-sectional TEM micrographs of the as-deposited $Ti_{0.34}Al_{0.66}N$ layers (FIG. 3a) revealed a dense and columnar microstructure with a high defect density and overlapping strain fields due to residual stresses. With respect to the initialised phase separation at 900° C. observed by XRD, the micrographs of the annealed sample revealed a structure similar to the as-deposited condition, except for column boundaries appearing more clearly defined. Annealing at 1100° C. resulted in phase separation of the metastable c-(Ti,Al)N structure into h-AlN precipitates in a c-(Ti,Al)N matrix, as evidenced by the selected-area electron diffraction (SAED) patterns. Original column boundaries were also dissolved at this temperature, and a fine-textured structure consisting of sub-grains of diameter 50–100 nm evolved. The texture was of a feather-like type with the subgrains spreading out in the growth direction in bundles limited by the parent grain; the parent grain being defined by original column boundaries in the 900° C.-annealed condition. From a comparison of SAED patterns in FIGS. 3(b) and (c), it appears that each sub-grain has inherited the initial orientation of the respective parent grain, however, within a few degrees of misorientation. Higher-magnification electron micrographs of this structure (inset FIG. 3c) reveal nanometer-sized grains of both cubic and hexagonal structure. After annealing at 1250° C., grains of both hexagonal and cubic phase were found to coarsen and become evenly distributed throughout the entire layer thickness. In addition, the grains adopted an equiaxed geometry with average diameter ~50 nm.

Figure 4A:
FIG. 4 is a TEM micrograph of $(Ti_{0.26}Al_{0.74})(N_{0.99}O_{0.01})_{0.89}$ layers in (a) as-deposited, (b) 120 min at 900° C. (c) 120 min at 1100° C. annealed conditions.
Figure 4B:
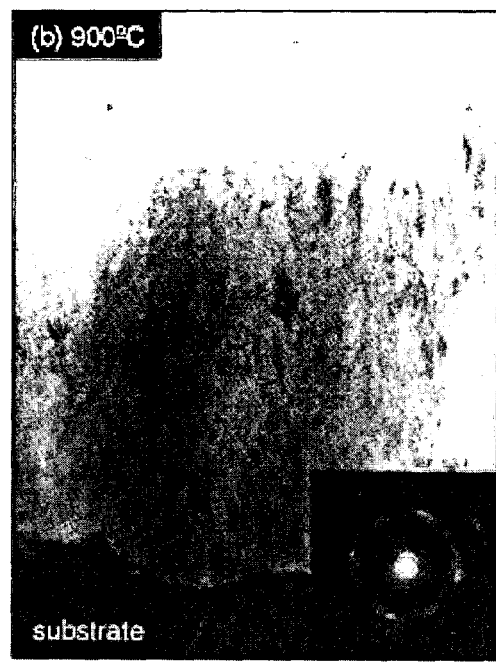
Figure 4C:

Cross-sectional TEM micrographs of the as-deposited $Ti_{0.26}Al_{0.74}N$ layers (FIG. 4a) revealed a structure with a fine texture of feather-like, small-diameter (~50 nm) grains elongated in the growth direction. Distinct columnar boundaries between regions of competing feather orientation are evident throughout the layer thickness. Apparently, this microstructure is similar in appearance to the one obtained after annealing the x=0.66 layer to 1100° C. (cf. FIG. 4c). Similar to the x=0.66 layers, the as-deposited microstructure of the x=0.74 layers remained essentially stable after annealing at 900° C. Annealing at 1100° C., however, resulted in a structure partially composed of above-mentioned small-diameter grains, partially of equiaxed grains of diameter ~50 nm. After annealing at 1250° C., though, a uniform layer structure of evenly distributed equiaxed grains evolved. Occasional pores located at grain boundary triple points were also found. The grain size had in this case decreased to an average diameter of ~30 nm.

From a scratch test it was concluded that there was no significant difference in critical load, $F_{N,C}$, between the as-deposited layers with different composition (~60 N) (variant A and E). However, after annealing an enhanced adhesion of variant B and F could be detected with a maximum $F_{N,C}$ of ~80 N of variant B. For higher annealing temperature $F_{N,C}$ decreased. Very low $F_{N,C}$ were seen for both variants annealed at 1250° C. (variant D and H) of ~20 N.

TABLE 1

| Variant | Ti/Al (at %) | Annealing Temp. [° C.] | K = [(h − 100)/ (c − 200)] | Phases detectable using XRD | Layer Morphology |
|---|---|---|---|---|---|
| A | 34/66 | As-dep. | 0 | c-(Ti,Al)N | Columnar |
| B | 34/66 | 900 | 0 | c-(Ti,Al)N | Columnar |
| C | 34/66 | 1100 | 0.22 | c-(Ti,Al)N h-AlN | Nano-crystalline |
| D | 34/66 | 1250 | 0.17 | c-(Ti,Al)N h-AlN | Nano-crystalline |
| E | 26/74 | As-dep. | Not defined | h-AlN[1] | Nano-crystalline |
| F | 26/74 | 900 | 1.92 | c-(Ti,Al)N h-AlN | Nano-crystalline |
| G | 26/74 | 1100 | 0.48 | c-(Ti,Al)N h-AlN | Nano-crystalline |
| H | 26/74 | 1250 | 0.21 | c-(Ti,Al)N h-AlN | Nano-crystalline |

[1]The c-(Ti,Al)N phase detected by TEM is XRD amorphous

TABLE 2

| Variant | Macro residual. $\sigma^M$ [GPa] | Critical Load, $F_{N,C}$ [N] | FWHM h-(100) °2θ | FWHM c-(200) °2θ |
|---|---|---|---|---|
| A | −2.3 ± 0.5 | 60 | — | 0.47 |
| B | −1.2 ± 0.1 | 80 | — | 0.67 |
| C | — | 50 | 0.53 | 0.56 |
| D | — | 20 | 0.29 | 0.71 |
| E | −1.7 ± 0.3 | 60 | 0.88 | — |
| F | −0.7 ± 0.7 | 70 | 0.71 | 0.76 |
| G | — | 50 | 0.65 | 0.69 |
| H | — | 20 | 0.38 | 0.55 |

EXAMPLE 2

Cemented carbide exchangeable end mills of type MM12-12012-B90P-M05 with composition 90 wt % WC and 10 wt % Co (WC grain size is 0.8 μm), were coated and annealed according to example 1 (the same name of the variants are used).

A semi-finishing copy milling test was performed using following cutting data:
Material: X100CrMoV 5 1 (SS2260), 57HRC
n=4050 rpm
$a_p=a_e=0.9$ mm
$v_f=900$ mm/min
$h_m=0.015$ mm After 61 min of cutting the maximum flank wear, Vbmax, was measured at two different positions (at the top and 1 mm from the top). Some of the tested variants had a shorter tool life than 61 min, those are marked in the table by "failed".

| Variant | Vb max [mm] at the top | Vb max [mm] 1 mm from the top |
|---|---|---|
| A | 0.78 | 0.12 |
| B | 1.05 | 0.21 |
| C | 0.24 | 0.04 |
| D | Failed | Failed |
| E | 0.68 | 0.10 |
| F | 0.38 | 0.07 |
| G | 0.79 | 0.23 |
| H | Failed | Failed |

This copy milling test shows that the variants C (this invention) followed by F perform best which are two variants with a microstructure having nanometer sized composite structure of h-AlN in a matrix c-(Ti,Al)N. The variants annealed at the highest temperatures failed immediately during testing. Interesting to note is that variant E with an as-deposited nano-crystalline microstructure does not perform as well as the annealed variants C and F.

EXAMPLE 3

The same variants as in example 2 were tested in a finishing copy milling test using following cutting data:
Material: X100CrMoV 5 1 (SS2260), 57HRC
n=8900 rpm
$a_p=a_e=0.4$ mm
$v_f=2250$ mm/min
$h_m=0.015$ mm After 57 min in cut was the flank wear measured according to example 2.

| Variant | Vb max [mm] At the top | Vb max [mm] 1 mm from the top |
|---|---|---|
| A | 1.08 | 0.22 |
| B | 0.85 | 0.21 |
| C | 0.24 | 0.04 |
| D | Failed | Failed |
| E | 0.78 | 0.14 |
| F | 0.41 | 0.10 |
| G | 0.91 | 0.18 |
| H | Failed | Failed |

Also this test favors the composite structured nanometer sized variant C (this invention) followed by F.

The described embodiments of the present invention are intended to be illustrative rather than restrictive, and are not intended to represent every possible embodiment of the present invention. Various modifications can be made to the disclosed embodiments without departing from the spirit or scope of the invention as set forth in the following claims, both literally and in equivalents recognized in law.

We claim:

1. A cutting tool insert comprising a substrate and a coating wherein the coating comprising one or more layers of refractory compounds of which at least one layer comprises a composite structured $(Ti_yAl_xMe_{1-x-y})N$ layer, where Me is one of the elements Zr, Hf, V, Nb, Ta, Cr, Mo, W or Si, and wherein:

x is between 0.60 and 0.80;

a ratio, $R=x/(x+y)$, is between 0.60 and 0.85;

a sum of Ti and Al subscripts, $S=x+y$, is between 0.7 and less than 1.0;

co-existence of crystalline hexagonal h-AlN and cubic $c$-$(Ti_yAl_xMe_{1-x-y})N$ as detected by X-ray diffraction (XRD), defined by the ratio K between the area of the h-AlN (100) peak at approximately 33° 2θ (=A(h-AlN)$_{100}$) and the $c$-$(Ti_yAl_xMe_{1-x-y})N$ (200) peak at approximately 43° 2θ (=(c-(Ti,Al,Me)N)$_{200}$) wherein $K=A(h-AlN)_{100}/A(c-(Ti,Al,Me)N)_{200}$, and K is >0.08; and a Full Width Half Maximum value of the $c$-$(Ti_bAl_aMe_{1-a-b})N$ (200) peak <1.4° 2θ, and the value of the h-AlN (100) peak is between 0.2 and 1.5° 2θ.

2. The cutting tool insert according to claim 1, wherein: x is between 0.60 and 0.75; the ratio, $R=x/(x+y)$, is between 0.60 and 0.80; the sum of Ti and Al subscript, $S=x+y$, is between 0.8 and 1.0; and K is >0.13.

3. The cutting tool insert according to claim 2, wherein the Full Width Half Maximum value of the $c$-$(Ti_yAl_xMe_{1-x-y})N$ (200) peak <1.0° 2θ, and the value of the h-AlN (100) peak is between 0.4 and 1.0° 2θ.

4. The cutting tool insert according to claim 1 wherein Me=V, Zr, Ta, Nb, or Si.

5. The cutting tool insert according to claim 1, wherein said layer comprises grains of $c$-$(Ti_bAl_aMe_{1-a-b})N$ and h-AlN, with a grain size of <20 nm.

6. The cutting tool insert according to claim 1, wherein said layer is deposited by PVD.

7. A cutting tool insert comprising a substrate and a coating wherein the coating comprising one or more layers of refractory compounds of which at least one layer comprises a composite structured $(Ti_yAl_xMe_{1-x-y})N$ layer, where Me is one of the elements Zr or Nb, and wherein:

x is between 0.60 and 0.80;

a ratio, $R=x/(x+y)$, is between 0.60 and 0.85;

a sum of Ti and Al subscripts, $S=x+y$, is between 0.7 and less than 1.0;

co-existence of crystalline hexagonal h-AlN and cubic $c$-$(Ti_yAl_xMe_{1-x-y})N$ as detected by X-ray diffraction (XRD), defined by the ratio K between the area of the h-AlN (100) peak at approximately 33° 2θ (=A(h-AlN)$_{100}$) and the $c$-$(Ti_yAl_xMe_{1-x-y})N$ (200) peak at approximately 43° 2θ (=A(c-(Ti,Al,Me)N)$_{200}$) wherein $K=A(h-AlN)_{100}/A(c-(Ti,Al,Me)N)_{200}$, and K is >0.08; and a Full Width Half Maximum value of the $c$-$(Ti_bAl_aMe_{1-a-b})N$ (200) peak <1.4° 2θ, and the value of the h-AlN (100) peak is between 0.2 and 1.5° 2θ.

8. The cutting tool insert according to claim 7, wherein: x is between 0.60 and 0.75; the ratio, $R=x/(x+y)$, is between 0.60 and 0.80; the sum of Ti and Al subscript, $S=x+y$, is between 0.8 and 1.0; and K is >0.13.

9. The cutting tool insert according to claim 8, wherein the Full Width Half Maximum value of the $c$-$(Ti_yAl_xMe_{1-x-y})N$ (200) peak <1.0° 2θ, and the value of the h-AlN (100) peak is between 0.4 and 1.0° 2θ.

10. The cutting tool insert according to claim 7, wherein said layer comprises grains of $c$-$(Ti_bAl_aMe_{1-a-b})N$ and h-AlN, with a grain size of <20 nm.

11. The cutting tool insert according to claim 7, wherein said layer is deposited by PVD.

* * * * *